United States Patent [19]

Gochermann et al.

[11] 4,009,054
[45] Feb. 22, 1977

[54] TERRESTRIAL SOLAR CELL GENERATOR

[75] Inventors: Hans Gochermann, Holm; Dieter Rüsch, Wedel, Holstein, both of Germany

[73] Assignee: Licentia Patent-verwaltungs-G.m.b.H., Frankfurt am Main, Germany

[22] Filed: Sept. 23, 1975

[21] Appl. No.: 616,036

[30] Foreign Application Priority Data

Sept. 25, 1974  Germany .................... 2445642

[52] U.S. Cl. .............................. 136/89 P; 29/572; 156/99; 250/239; 136/89 H
[51] Int. Cl.$^2$ ................... H01L 31/04; C03C 27/10
[58] Field of Search .......... 136/89; 29/572; 156/99; 250/239

[56] References Cited

UNITED STATES PATENTS

| | | |
|---|---|---|
| 2,222,788 | 11/1940 | Touceda et al. ................... 136/89 |
| 2,606,215 | 8/1952 | Lamb ................................ 136/89 |
| 3,532,551 | 10/1970 | Webb ................................ 136/89 |
| 3,575,721 | 4/1971 | Mann ................................ 136/89 |
| 3,957,537 | 5/1976 | Baskett et al. ..................... 136/89 |

*Primary Examiner*—John H. Mack
*Assistant Examiner*—Aaron Weisstuch
*Attorney, Agent, or Firm*—Spencer & Kaye

[57] ABSTRACT

A terrestrial solar cell generator including a plurality of solar cells mounted in a housing and interconnected by a plurality of leads with the solar cells being protected against adverse environmental conditions. The housing is entirely formed of the same radiation resistant material and encloses the solar cells and the connecting leads on all sides.

8 Claims, 4 Drawing Figures

TERRESTRIAL SOLAR CELL GENERATOR

BACKGROUND OF THE INVENTION

The present invention relates to a terrestrial solar cell generator whose solar cells are arranged to be protected against adverse environmental influences.

The conversion of light into electrical energy has been known for many years and has been used with preference for the generation of energy for satellites and spacecraft. For terrestrial use the costs involved were too high. However, the energy crises of the recent past has resulted in renewed consideration concerning the possible use of solar cells for terrestrial use.

Thus it has become known to use solar cells to charge batteries for radio and navigation instruments on board ships. In planning and in part reduced to practice is the supplying of electric current to locations which are rather inaccessible and which could be supplied with current less expensively by solar batteries, than by dry cell batteries, fuel cells or specially laid electrical cables.

A known solar cell generator for terrestrial use includes a box-shaped housing. The solar cells, which are arranged on a printed circuit board and are soldered thereto, are disposed on the bottom of the housing where they are electrically insulated. The cells are encased in a transparent plastic such as silicone rubber and are covered with an additional protective cover glass. The electrical connection is disposed on the underside of the bottom surface of the housing. This solar cell generator is relatively heavy and very expensive to produce.

The periodical "Elektronik Journal", 1974, Issue No. 8, pages 28 and 29, indicates that the solar cell generator can be accommodated in a housing which is made of a glass fiber reinforced epoxy resin and encased in an elastic plastic, e.g. silicone rubber or the like. Such an installation of the solar cells is also not without problems since there will always be thermomechanical stresses due to the different materials employed, which stresses would lead to separation of the solar cells and the encapsulant Moreover, all encapsulants used thus far are not resistant to ultraviolet radiation, i.e., they become cloudy or dull, and thus reduce the energy output.

SUMMARY OF THE INVENTION

It is the object of the present invention to provide a terrestrial solar cell generator which is able to withstand thermomechanical stresses without damage, can be produced economically and employs a radiation resistant material, i.e., a material which will not become cloudy or dull when exposed to ultraviolet radiation, for the housing.

The above object is achieved according to the present invention by forming the housing for the solar cell generator entirely of the same material which encases the solar cells and their connecting elements or leads on all sides. Suitable materials for the housing are, for example, modified polyester resin, acrylic resin, and epoxy resin with or without glass fiber reinforcement. It is also possible to provide a thermoplastic material from among the polycarbonates which are known by various trade names or to use glass with the appropriate properties.

If the electrical connecting elements which are embedded in the plastic body are provided with a circular shape this simultaneously results in a substantial mechanical reinforcement.

The solar cell generator according to the invention has the significant advantages that the mechanical homogeneous structure of the housing provides less thermal problems and it can be mass produced very economically. Moreover this housing leads to good optical matching of the solar cells and no transmission losses will occur. In fact, to the contrary, a gain in cell output can be noted when they are covered. Finally, the electrical connections can be produced without difficulties.

DETAILED DESCRIPTION OF THE PREFERRED EMBODIMENTS

Figure 1:
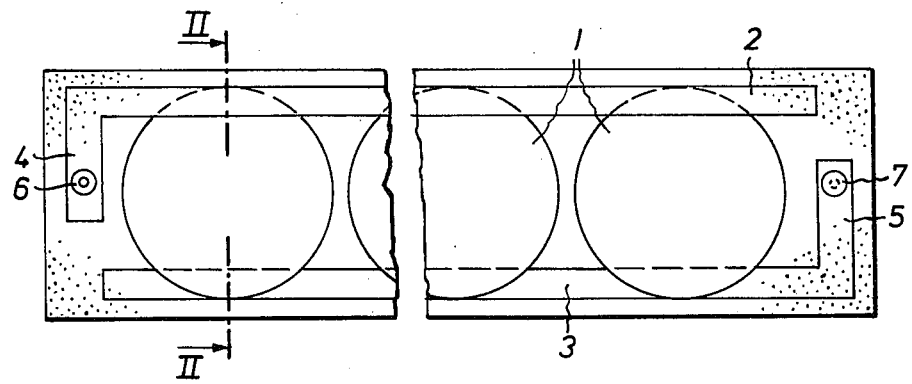
FIG. 1 is a plan view of one embodiment of the invention.

Referring now to FIG. 1 there is shown a solar cell generator including a plurality of solar cells 1, e.g., silicon solar cells of conventional construction, which are arranged in a row. To provide an electrical connection of the solar cells 1, a pair of strip-shaped connecting elements or leads 2 and 3 are provided which extend along the row of solar cells and are electrically connected thereto. As shown, one end of each of the leads 2 and 3 extends substantially perpendicular to the remainder thereof so that the leads 2 and 3 are substantially L-shaped with the shorter ends 4 and 5 respectively extending along opposite ends of the row of solar cells 1. The shorter ends 4 and 5 of the L-shaped connecting elements or leads 2 and 3 constitute contacts for connecting terminals 6 and 7 which may be plug-in contacts, for example, and serve to electrically connect the illustrated unit with the adjacent identically designed units of the solar cell generator.

Figure 2:
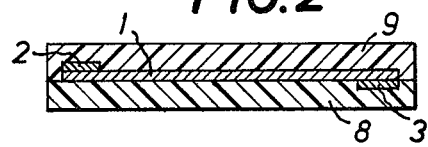
FIG. 2 is a sectional view along the line II—II of FIG. 1.

The structure of the embodiment of the solar cell generator of FIG. 1 is shown in section in FIG. 2. If the manual application technique is employed to produce the solar cell generator, the solar cells 1 and their leads 2 and 3 are placed onto a glass fiber layer or sheet 8 which has been saturated with one of the materials mentioned above, e.g., a resin, and then covered with a second glass fiber layer or sheet 9 which has been saturated with the same resin. After curing of the resin the solar cells 1 and their connectors 2 and 3 are encased in a uniform compound. Thermal problems can be considerably reduced with such a mechanical homogeneous structure of the housing of the solar cell generator.

Figure 3:
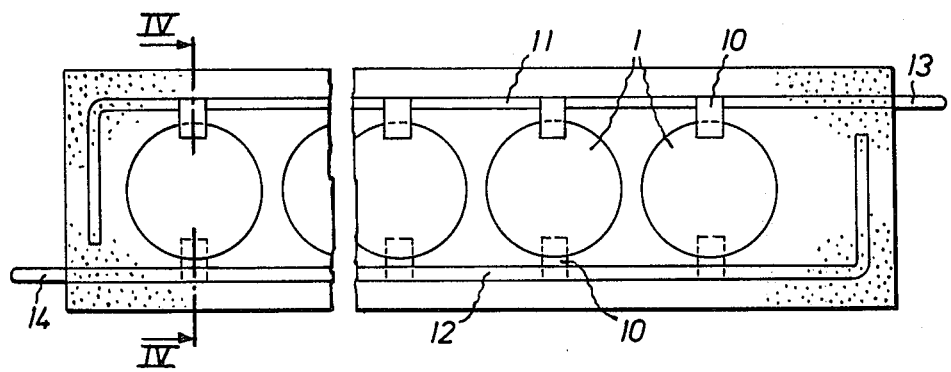
FIG. 3 is a plan view of a further embodiment of the invention.
Figure 4:
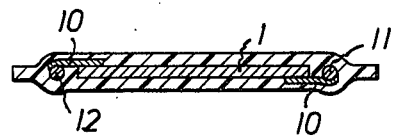
FIG. 4 is a sectional view along the line IV—IV of FIG. 3.

In FIG. 3 which shows a further embodiment of the solar cell generator according to the invention, the solar cells 1 are connected to the connecting leads 11 and 12 via connecting strips 10 and the connecting leads 11 and 12 exit at the frontal faces or end surfaces of the unit to provide p-contact 13 and n-contact 14 for the solar cells 1. This permits simple electrical connection to the adjacent units. FIG. 4, which is a sectional view of the embodiment of FIG. 3, shows the structure of the unit. The connection leads 11 and 12, which as shown are also L-shaped, are provided with a circular cross section with a diameter of approximately 0.1 inch (2 m/m), and thus, contribute substantially to the mechanical stiffening of the unit of the solar cell generator. The production may be effected generally in the same manner as described in connection with FIG. 1. As with the embodiment of FIG. 1, a transparent glass fiber reinforced resin or a glass or a material without glass fiber reinforcement can be used for the housing.

A further possibility of producing the solar cell generator according to the invention is to place the solar cells 1 with their light-sensitive sides onto a disc of a plastic having an acrylic base which substantially transmits radiation from the sum and to fill the rear side with a liquid or grainy plastic of the same composition so that the solar cells and their connecting leads then are likewise embedded on all sides in a uniform material. Such plastics are sold under the trade name of "Plexiglas" by the Rohm and Haas Co.

The same firm also produces Acrylic resin which is known as "Plexiglas", Type P 55. An example of a modified polyester resin which can be used is known as "Palatal" P 6L, and is sold by BASF. A suitable expoxy resin is known as "Araldit", Type LY 560, sold by Ciba-Geigy, Germany, while a suitable glass fiber is sold by InterglasTextil, Germany, with the type designation "Glassfilament" 90070. Moreover, a thermoplastic which is suitable for sheathing, known as "Makrolon" 2800 sold by Bayer, can be taken into consideration. Finally "Glaslot" 8465 of Messrs. Schott, is usable for glass.

It will be understood that the above description of the present invention is susceptible to various modifications, changes and adaptations, and the same are intended to be comprehended within the meaning and range of equivalents of the appended claims.

What is claimed is:

1. In a terrestrial solar cell generator including a plurality of solar cells, a plurality of leads electrically connecting said solar cells to one another, and a transparent housing for said solar cells; the improvement wherein said housing is entirely formed of the same radiation resistant glass fiber reinforced plastic material and encapsulates said solar cells and said connecting leads on all sides, whereby a terrestrial sollar cell generator with improved thermal stress properties and whose solar cells are protected against adverse enviromental influences is provided.

2. A solar cell generator as defined in claim 1 wherein: said solar cells are arranged in a row; and said leads include a pair of leads each having a first portion which extends along the row of solar cells and is connected thereto and a second portion which extends substantially perpendicular to said first portion at one end thereof, said second portions extending along opposite ends of said row of solar cells.

3. A solar cell generator as defined in claim 2 further comprising connector means for electrically contacting said second portions of said pair of leads.

4. A solar cell generator as defined in claim 2 wherein said leads each have a circular cross section.

5. A solar cell generator as defined in claim 4 wherein the other end of each of said leads extends through the adjacent end surface of said housing and forms a connector for making electrical connection to said generator.

6. A solar cell generator as defined in claim 1 wherein each of said leads is provided with a plug-in connection at one end thereof for making electrical connection to said solar cell generator.

7. A terrestrial solar cell generator as defined in claim 1 wherein said housing in which said solar cells and said leads are encapsulated is a laminate of glass fiber reinforced plastic sheets.

8. In a terrestrial solar cell generator comprising a plurality of solar cells which are electrically connected together via electrical leads and wholly encapsulated in a transparent material; the improvement wherein said transparent material in which said solar cells are encapsulated is a laminate of glass fiber reinforced plastic.

* * * * *